United States Patent
Mori

(10) Patent No.: US 10,192,769 B2
(45) Date of Patent: *Jan. 29, 2019

(54) THERMOSETTING ADHESIVE SHEET AND SEMICONDUCTOR DEVICE MANUFACTURING METHOD

(71) Applicant: DEXERIALS CORPORATION, Tokyo (JP)

(72) Inventor: Daichi Mori, Tochigi (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/544,050

(22) PCT Filed: Mar. 29, 2016

(86) PCT No.: PCT/JP2016/060142
§ 371 (c)(1),
(2) Date: Jul. 17, 2017

(87) PCT Pub. No.: WO2016/158959
PCT Pub. Date: Oct. 6, 2016

(65) Prior Publication Data
US 2017/0372936 A1    Dec. 28, 2017

(30) Foreign Application Priority Data
Mar. 30, 2015  (JP) .................................. 2015-068236

(51) Int. Cl.
*H01L 21/683*  (2006.01)
*C09J 133/10*  (2006.01)
(Continued)

(52) U.S. Cl.
CPC ............ *H01L 21/6836* (2013.01); *C09J 4/00* (2013.01); *C09J 7/10* (2018.01); *C09J 7/35* (2018.01);
(Continued)

(58) Field of Classification Search
None
See application file for complete search history.

(56) References Cited

U.S. PATENT DOCUMENTS

2009/0227089 A1    9/2009  Plaut et al.
2009/0261483 A1*  10/2009  Katogi ...................... C09J 4/06
                                                        257/783
(Continued)

FOREIGN PATENT DOCUMENTS

JP    2002-280329 A    9/2002
JP    2010-521555 A    6/2010
(Continued)

OTHER PUBLICATIONS

Jun. 28, 2016 International Search Report issued in International Patent Application No. PCT/JP2016/060142.
(Continued)

*Primary Examiner* — Asok K Sarkar
(74) *Attorney, Agent, or Firm* — Oliff PLC

(57) ABSTRACT

A thermosetting adhesive sheet and a method for manufacturing a semiconductor device capable of reducing warping of a semiconductor wafer are provided. The thermosetting adhesive sheet is to be applied to a grinding-side surface of a semiconductor wafer and cured before dicing and includes a polymer containing an elastomer, a (meth) acrylate containing more than 95% wt of a polyfunctional (meth) acrylate with respect to total (meth)acrylate content, an organic peroxide having a one-minute half-life temperature of 130° C. or lower, and a transparent filler. Thereby, the thermo-
(Continued)

setting adhesive sheet significantly shrinks and generates a stress opposing a warp direction of the semiconductor wafer, enabling the semiconductor wafer to be maintained in a flat state.

15 Claims, 6 Drawing Sheets

(51) Int. Cl.
C09J 133/00 (2006.01)
H01L 21/304 (2006.01)
C09J 133/08 (2006.01)
H01L 21/78 (2006.01)
C09J 4/00 (2006.01)
C09J 7/35 (2018.01)
C09J 7/10 (2018.01)
C09J 11/04 (2006.01)
C08K 5/00 (2006.01)
C08K 5/14 (2006.01)

(52) U.S. Cl.
CPC ........... *C09J 133/00* (2013.01); *C09J 133/08* (2013.01); *C09J 133/10* (2013.01); *H01L 21/304* (2013.01); *H01L 21/683* (2013.01); *H01L 21/78* (2013.01); *C08K 5/0025* (2013.01); *C08K 5/14* (2013.01); *C09J 11/04* (2013.01); *C09J 2201/61* (2013.01); *C09J 2203/326* (2013.01); *C09J 2205/102* (2013.01); *C09J 2433/00* (2013.01); *H01L 2221/68322* (2013.01); *H01L 2221/68327* (2013.01)

(56) References Cited

U.S. PATENT DOCUMENTS

| 2010/0056725 | A1 | 3/2010 | Larson et al. |
| 2012/0025404 | A1 | 2/2012 | Shiga et al. |
| 2015/0011711 | A1* | 1/2015 | Chen .................... B29C 43/003 525/274 |
| 2015/0179494 | A1 | 6/2015 | Kawamori et al. |

FOREIGN PATENT DOCUMENTS

| JP | 2011-513995 A | 4/2011 |
| JP | 2011-159694 A | 8/2011 |
| JP | 2012-033555 A | 2/2012 |
| JP | 2013-140895 A | 7/2013 |
| JP | 5615471 B1 | 10/2014 |
| KR | 10-2009-0116462 A | 11/2009 |
| WO | 2014/003056 A1 | 1/2014 |

OTHER PUBLICATIONS

Jul. 10, 2018 Office Action issued in Korean Application No. 10-2017-7017891.
Oct. 29, 2018 Office Action issued in Japanese Patent Application No. 2015-068236.

* cited by examiner

THERMOSETTING ADHESIVE SHEET AND SEMICONDUCTOR DEVICE MANUFACTURING METHOD

TECHNICAL FIELD

The present disclosure relates to a thermosetting adhesive sheet for reinforcing a semiconductor wafer and a method for manufacturing a semiconductor device in order to prevent cracks during a dicing step. This application claims priority to Japanese Patent Application No. 2015-068236 filed on Mar. 30, 2015, the entire contents of which are hereby incorporated by reference.

BACKGROUND ART

In manufacturing processes of semiconductor chips, dicing (separation) processes cause significant stresses in semiconductor wafers. This can cause microcracks in semiconductor wafers and might increase defect rates.

To prevent such problems, applying a thermosetting adhesive sheet immediately before dicing (after backgrinding) to reinforce the semiconductor wafer has been proposed (for example, refer to PLT 1).

However, thinner semiconductor wafers have increased semiconductor wafer warping which sometimes impedes dicing tape application.

CITATION LIST

Patent Literature

PLT 1: Japanese Unexamined Patent Application Publication No. 2002-280329

SUMMARY OF INVENTION

Technical Problem

The present invention has been proposed in view of such conventional circumstances and provides a thermosetting adhesive sheet and a method for manufacturing a semiconductor device capable of reducing warping of a semiconductor wafer.

Solution to Problem

In order to solve the aforementioned problems, according to an aspect of the present invention, a thermosetting adhesive sheet to be applied to a grinding-side surface of a semiconductor wafer when dicing the semiconductor wafer includes a polymer containing an elastomer, a (meth)acrylate containing more than 95 wt % of a polyfunctional (meth)acrylate with respect to total (meth)acrylate content, an organic peroxide having a one-minute half-life temperature of 130° C. or lower, and a transparent filler.

Furthermore, according to an aspect of the present invention, a method for manufacturing a semiconductor device includes a grinding step of grinding a semiconductor wafer, a curing step of applying a thermosetting adhesive sheet to a grinding-side surface of the semiconductor wafer and curing the thermosetting adhesive sheet to reduce warping of the semiconductor wafer, and a dicing step of applying a dicing tape to a side of the semiconductor wafer to which the thermosetting adhesive sheet is applied and dicing the semiconductor wafer.

Advantageous Effects of Invention

High polyfunctional (meth)acrylate content of the thermosetting adhesive sheet according to the present disclosure significantly increases shrinkage from curing of the thermosetting adhesive sheet, thereby reducing wafer warping. Therefore, the thermosetting adhesive sheet according to the present disclosure allows production of the wafer in a flat state, thus achieving a high-quality semiconductor device.

DESCRIPTION OF EMBODIMENTS

Embodiments of the present disclosure will now be described in detail according to the following order.
1. Thermosetting Adhesive Sheet
2. Semiconductor Device Manufacturing Method
3. Examples

1. Thermosetting Adhesive Sheet

A thermosetting adhesive sheet according to this embodiment is a reinforcing sheet having a thermosetting adhesive layer to be applied to a grinding-side surface of a semiconductor wafer when dicing the semiconductor wafer to reinforce the wafer and prevent cracks.

Figure 1:
FIG. 1 is a schematic cross-sectional view illustrating a thermosetting adhesive sheet.

FIG. 1 is a schematic cross-sectional view illustrating a thermosetting adhesive sheet. As illustrated in FIG. 1, in the thermosetting adhesive sheet, a matrix film layer 11 and a thermosetting adhesive layer 12 are laminated.

Examples of the matrix film layer 11 include plastic films such as those of polyethylene terephthalate, polyethylene, polypropylene, and polyester, as well as porous matrix materials such as those of paper, cloth, and nonwoven fabric.

The thermosetting adhesive layer 12 contains a polymer containing an elastomer, a (meth)acrylate containing more than 95 wt % of polyfunctional (meth)acrylate with respect to total (meth)acrylate content, an organic peroxide having a one-minute half-life temperature of 130° C. or lower, and a transparent filler. It should be noted that, in the present disclosure, (meth)acrylate is meant to include acrylic acid esters (acrylates) and methacrylic acid esters (methacrylates).

The polymer contains an elastomer and more preferably a phenoxy resin and an elastomer. This can impart appropriate flexibility to the thermosetting adhesive sheet after curing.

Examples of the elastomer include acrylic elastomers, butadiene elastomers, ethylene elastomers, propylene elastomers, and styrene elastomers, among others; these may be used individually or in a combination of two or more. Among these, an acrylic elastomer having excellent transparency is preferably used. Examples of commercially available acrylic elastomers include tradename "SG-80H" manufactured by Nagase ChemteX Corporation.

Examples of phenoxy resins include fluorene phenoxy resins, bisphenol phenoxy resins, novolac phenoxy resins, naphthalene phenoxy resins, and biphenyl phenoxy resins; these may be used individually or in a combination of two or more. Among these, a fluorene phenoxy resin exhibiting high heat-tolerance is preferably used. Examples of commercially available fluorene phenoxy resins include trade name "FX293" manufactured by NIPPON STEEL & SUMIKIN CHEMICAL CO., LTD.

Furthermore, weight average molecular weight (Mw) of the polymer is preferably 5,000 to 150,000 and more preferably 10,000 to 80,000. Insufficient weight average molecular weight (Mw) tends to degrade sheet characteristics, and excessive weight average molecular weight (Mw) tends to degrade compatibility with other constituents.

Moreover, content of the polymer is preferably 5 to 100 pts. mass and more preferably 10 to 40 pts. mass with respect to 50 pts. mass of (meth)acrylate. Insufficient or excessive content of the polymer tends to degrade sheet characteristics.

The (meth)acrylate contains a polyfunctional (meth)acrylate as a main constituent and the polyfunctional (meth)acrylate is contained at more than 95 wt % with respect to total (meth)acrylate content. This increases shrinkage caused by curing the thermosetting adhesive sheet, thereby reducing wafer warping.

Other than polyfunctional (meth)acrylates, examples of monofunctional (meth)acrylates include polyalkylene glycol ester monomers and alkyl (meth)acrylates having branched or linear alkyl groups, among others. Examples of polyalkylene glycol ester monomers include hydroxyethyl (meth)acrylate, hydroxypropyl (meth)acrylate, 4-hydroxy-butyl acrylate, polyethylene glycol mono(meth)acrylate, polypropylene glycol mono(meth)acrylate, polybutylene glycol mono(meth)acrylate, and polyethylene glycol polypropylene glycol mono(meth)acrylate, among others; these may be used individually or in a combination of two or more.

Among polyfunctional (meth)acrylates, examples of bifunctional (meth)acrylates include, tricyclodecane dimethanol di(meth)acrylate, dimethylol-tricyclodecane (meth)acrylate, bisphenol A EO-modified di(meth)acrylate, 1,9-noanediol di(meth)acrylate, 1,10-decanediol di(meth)acrylate, 2-hydroxy-3-acryloyloxypropyl (meth)acrylate, propoxylated bisphenol A di(meth)acrylate, diethylene glycol di(meth)acrylate, neopentyl glycol di(meth)acrylate, 1,4-butanediol di(meth)acrylate, polyethylene glycol (200) di(meth)acrylate, tetraethylene glycol di(meth)acrylate, polyethylene glycol (400) di(meth)acrylate, cyclohexane dimethanol di(meth)acrylate, alkoxylated hexanediol di(meth)acrylate, alkoxylated cyclohexane dimethanol di(meth)acrylate, ethoxylated (4) bisphenol A di(meth)acrylate, ethoxylated (10) bisphenol A di(meth)acrylate, polyethylene glycol (600) di(meth)acrylate, alkoxylated neopentyl glycol di(meth)acrylate, dioxane glycol di(meth)acrylate, and isocyanurate EO-modified di(meth)acrylate, among others; these may be used individually or in a combination of two or more. Among these, in view of properties such as reaction and crosslink properties, tricyclodecane dimethanol (meth)acrylate is preferably used. Examples of commercially available bifunctional (meth)acrylates include those manufactured by SHIN-NAKAMURA CHEMICAL CO, LTD., such as trade names "DCP" (tricyclodecane dimethanol dimethacrylate, (meth)acrylic equivalent weight (molecular weight/functional group number)=166), and "A-DCP," (tricyclodecane dimethanol diacrylate, (meth)acrylic equivalent weight (molecular weight/functional group number)=152), among others.

Among polyfunctional (meth)acrylates, examples of trifunctional or higher functional (meth)acrylates include isocyanurate EO-modified tri(meth)acrylate, dipentaerythritol hexa(meth)acrylate, pentaerythritol tri(meth)acrylate, EO-modified pentaerythritol tri(meth)acrylate, ε-caprolactone-modified tris-(-2-acryloxyethyl) isocyanurate, trimethylol propane tri(meth)acrylate, ε-caprolactone-modified tris(acroxyethyl) (meth)acrylate, ethoxylated (20) trimethylolpropane tri(meth)acrylate propoxylated (3) trimethylolpropane tri(meth)acrylate, propoxylated (6) trimethylolpropane tri(meth)acrylate, ethoxylated (9) trimethylolpropane tri(meth)acrylate, propoxylated (3) glyceryl tri(meth)acrylate, ethoxylated (4) pentaerythritol tetra(meth)acrylate, pentaerythritol tetra(meth)acrylate, ditrimethylolpropane tetra(meth)acrylate, dipentaerythritol penta(meth)acrylate, EO-modified dipentaerythritol penta(meth)acrylate, and dipentaerythritol hexa(meth)acrylate, among others; these may be used individually or in a combination of two or more. Among these, isocyanurate EO-modified tri(meth)acrylate and dipentaerythritol hexa(meth)acrylate are preferable in view of, for example, reaction and crosslinking properties. Examples of commercially available trifunctional or higher functional (meth)acrylate include trade names "M-315" (compound of isocyanurate ethylene-oxide-modified diacrylate and isocyanurate ethylene-oxide-modified triacrylate (3 to 13% isocyanurate ethylene-oxide-modified diacrylate content), (meth)acrylic equivalent (molecular weight/number of functional groups)=approximately 100), manufactured by TOAGOSEI CO., LTD, "A-DPH" (dipentaerythritol hexaacrylate, (meth)acrylic equivalent weight (molecular weight/number of functional groups)=96), manufactured by SHIN-NAKAMURA CHEMICAL CO, LTD., and "UV-1700 B," (molecular weight/number of functional groups)=222, manufactured by Nippon Synthetic Chemical Industry Co., Ltd., among others.

Regarding polyfunctional (meth)acrylates, even when formally having two or more (meth)acryloyl groups, compounds having an exceedingly large molecular weight relative to number of functional groups tend to exhibit properties similar to the above-described monofunctional acrylates. Accordingly, it is preferable to select a polyfunctional (meth)acrylate in consideration of a "(meth)acrylic equivalent weight (g/eq)" obtained by dividing the molecular weight by the number of functional groups, or "number of functional groups per unit of molecular weight" obtained by dividing the number of functional groups by the molecular weight. In the case of selection in consideration of (meth)acrylic equivalent weight (g/eq), it is preferable to use an additive average value of the (meth)acrylic equivalent weights, which is the sum of the values obtained by multiplying the (meth)acrylic equivalent weights (g/eq) by respective percentages of total (meth)acrylate content. Moreover, in the case of selection in consideration of the number of functional groups per unit of molecular weight, it is preferable to use the average crosslink density, which is the sum of the values obtained by multiplying the number of functional groups per unit of molecular weights by respective percentages among total (meth)acrylate content.

The additive average value of the (meth)acrylic equivalent weights of the (meth)acrylate is preferably 80 to 230 g/eq and more preferably 100 to 200 g/eq. Decreasing the additive average value of the (meth)acrylic equivalent weights increases the shrinkage rate, and increasing the additive average value of the (meth)acrylic equivalent weights decreases the shrinkage rate. Thus, insufficient additive average values of the (meth)acrylic equivalent weights tend to degrade semiconductor wafer adhesion characteristics and excessive values might not cancel semiconductor wafer warping.

Average crosslink density of the (meth)acrylate is preferably 2.0E-03 to 5.0E-02 and more preferably 5.0E-03 to 1.0E-02. Decreasing the average crosslink density decreases the shrinkage rate, and increasing the average crosslink density increases the shrinkage rate. Therefore, insufficient average crosslink point numbers impede cancelling semiconductor wafer warping, and excessive numbers tend to degrade characteristics such as adherence to the semiconductor wafer.

Content of the (meth)acrylate is preferably 10 to 100 pts. mass and more preferably 20 to 70 pts. mass with respect to 25 pts. mass of the polymer. Insufficient content of the (meth)acrylate impedes cancelling semiconductor wafer warping, and excessive content tends to degrade sheet characteristics.

The organic peroxide has a one-minute half-life temperature of 130° C. or less, and more preferably 80 to 120° C. Excessive one-minute half-life temperatures impede fast reaction rates, and insufficient one-minute half-life temperatures tend to degrade normal-temperature storage-stability.

Examples of such organic peroxides include dilauroyl peroxide (one-minute half-life temperature: 116.4° C.), dibenzoyl peroxide (one-minute half-life temperature: 130.0° C.), di(4-methylbenzoyl) peroxide (one-minute half-life temperature: 128.2° C.), 1,1,3,3-tetramethylbutyl peroxy-2-ethylhexanoate (one-minute half-life temperature: 124.3° C.), di(3,5,5-trimethyl hexanoyl) peroxide (one-minute half-life temperature: 112.6° C.), t-butyl peroxypivalate (one-minute half-life temperature: 110.3° C.), t-hexyl peroxypivalate (one-minute half-life temperature: 109.1° C.), t-butyl peroxyneoheptanoate (one-minute half-life temperature: 104.6° C.), t-butyl peroxyneodecanoate (one-minute half-life temperature: 103.5° C.), t-hexyl peroxyneodecanoate (one-minute half-life temperature: 100.9° C.), di(2-ethylhexyl) peroxydicarbonate (one-minute half-life temperature: 90.6° C.), di(4-t-butylcyclohexyl) peroxydicarbonate (one-minute half-life temperature: 92.1° C.), 1,1,3,3-tetramethylbutyl peroxyneodecanoate (one-minute half-life temperature: 92.1° C.), diisobutyryl peroxide (one-minute half-life temperature: 85.1° C.), di-sec-butyl peroxydicarbonate (one-minute half-life temperature: 85.1° C.), di-n-propyl peroxydicarbonate (one-minute half-life temperature: 85.1° C.), and cumyl peroxyneodecanoate (one-minute half-life temperature: 85.1° C.), among others; these may be used individually or in a combination of two or more. Among these, in view of reaction and crosslinking properties, dilauroyl peroxide and 1,1,3,3-tetramethylbutyl peroxy-2-ethylhexanoate are preferably used. Examples of commercially available dilauroyl peroxides include trade name PEROYL L manufactured by NOF CORPORATION, among others, and examples of commercially available 1,1,3,3-tetramethylbutyl peroxy-2-ethylhexanoate include trade name PEROCTA O manufactured by NOF CORPORATION, among others.

Furthermore, content of the organic peroxide is preferably 0.1 to 20 pts. mass and more preferably 1 to 10 pts. mass with respect to 50 pts. mass of (meth)acrylate. Insufficient content of the organic peroxide degrades reaction properties, and excessive content tends to reduce product lifetime.

The transparent filler may be inorganic or organic and it is preferable to use a material that is transparent to infrared light used in alignment. Examples of usable materials that are transparent to infrared light include silica, silicon, germanium, quartz, and sapphire, among others; these may be used individually or in a combination of two or more. Among these, in view of laser mark visibility, silica is preferably used.

Content of the transparent filler is preferably 50 to 150 pts. mass and more preferably 80 to 120 pts. mass with respect to 25 pts. mass of the polymer. Insufficient content of the transparent filler tends to degrade wafer warping reduction effects, and excessive transparent filler content tends to degrade adhesion reliability.

Furthermore, as another additive, it is preferable to add a colorant. The colorant generates contrast between laser marking portions and other portions, improving laser mark visibility. Examples of the colorant include carbon black, titanium black, titanium oxide, and iron oxide, among others; these may be used individually or in a combination of two or more. Among these, in view of improving contrast, carbon black is preferably used.

Furthermore, it is preferable to add a silane coupling agent. (Meth)acrylic-based, epoxy-based, amino-based, mercapto-based, sulfide-based, and ureido-based silane coupling agents may be used; however, in the present embodiment, a (meth)acrylic silane coupling agent is preferably used. This can improve adhesion reliability at interfaces between organic and inorganic materials.

Moreover, the thermosetting adhesive sheet preferably has a transmittance of 30% or more at a wavelength of 1000 nm. Insufficient infrared transmittance would impede alignment using infrared.

The thermosetting adhesive sheet according to the present embodiment can reduce warping of a semiconductor wafer by applying the sheet to a grinding-side surface of the semiconductor wafer and curing the sheet. It is thus possible to facilitate dicing and improve productivity.

2. Semiconductor Device Manufacturing Method

Next, a method for manufacturing a semiconductor device using the above-described thermosetting adhesive sheet will be described. A method for manufacturing a semiconductor device according to the present embodiment includes a grinding step of grinding a semiconductor wafer, a step of applying a thermosetting adhesive sheet to a grinding-side surface of the semiconductor wafer and curing the thermosetting adhesive sheet to reduce warping of the semiconductor wafer, and a dicing step of applying a dicing tape to a side of the semiconductor wafer to which the thermosetting adhesive sheet is applied and dicing the semiconductor wafer. Because warping of the semiconductor wafer can be reduced, it is possible to facilitate dicing and improve productivity.

Hereinafter, an example method for manufacturing a semiconductor device will be described. The example method for manufacturing a semiconductor device includes a protective tape applying step (A) of applying a protective tape having an adhesive agent layer, a grinding step (B), a thermosetting resin sheet applying step (C), a protective tape peeling step (D), a curing step (E), an adhesive tape applying step (F), a dicing step (G), an expanding step (H), a picking-up step (I), and a mounting step (J). It should be noted that the protective tape peeling step (D) may be performed before the thermosetting resin sheet applying step (C).

(A) Protective Tape Applying Step

Figure 2:
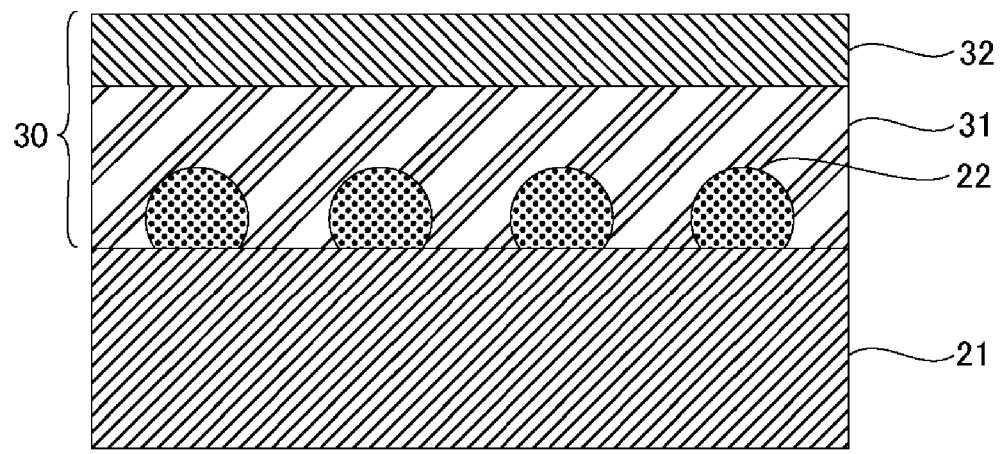
FIG. 2 is a schematic cross-sectional view illustrating a BG tape applying step.

FIG. 2 is a schematic cross-sectional view illustrating a protective tape applying step. The protective tape applying step includes applying a protective tape 30 to a surface of a wafer 21 having a protruding electrode 22 formed thereon. The application temperature for applying the protective tape 30 is preferably 25 to 100° C. and more preferably 40 to 80° C. in view of reducing voids, improving wafer adhesion properties, and preventing warping of the wafer after grinding.

The wafer 21 includes an integrated circuit formed on a surface of a semiconductor such as silicon and the protruding electrode 22, which is known as a bump and used for connecting. The thickness of the wafer 21 is without particular limitation but is preferably 200 to 1000 µm.

Examples of the protruding electrode 22, without particular limitation, include solder-containing low-melting point bumps or high-melting point bumps, tin bumps, silver-tin bumps, silver-tin-copper bumps, gold bumps, and copper bumps, among others. Moreover, the height of the protruding electrode 22 is without particular limitation but is preferably from 10 to 200 µm.

The protective tape 30 is known as backgrind tape and protects the wafer from scratches, cracks, and contamination in the following grinding step (B). As illustrated in FIG. 2, in the protective tape 30, a thermoplastic resin layer 31 and a matrix film layer 32 are laminated; the protective tape 30 is applied so that the thermoplastic resin layer 31 contacts the surface on which the protruding electrode 22 is formed and the protruding electrode 22 embeds into the thermoplastic resin layer 31.

Examples of the thermoplastic resin layer 31 include EVA (ethylene vinyl acetate), polyethylene, polypropylene, polyamide, polyacetal, polyethylene terephthalate, polybutylene terephthalate, fluoropolymer, polyphenylene sulfide, polystyrene, ABS resin, acrylic resin, polycarbonate, polyurethane, polyvinyl chloride, and polyphenylene oxide, among others; these may be used individually or in a combination of two or more.

Examples of the matrix film layer 32 include plastic films such as those of polyethylene terephthalate, polyethylene, polypropylene, and polyester, as well as porous matrix materials such as those of paper, cloth, and nonwoven fabric.

It should be noted that the protective tape 30 is not limited to the configuration described above, and other layers may be formed on the surface of any layer or between any adjacent layers.

(B) Grinding Step

Figure 3:
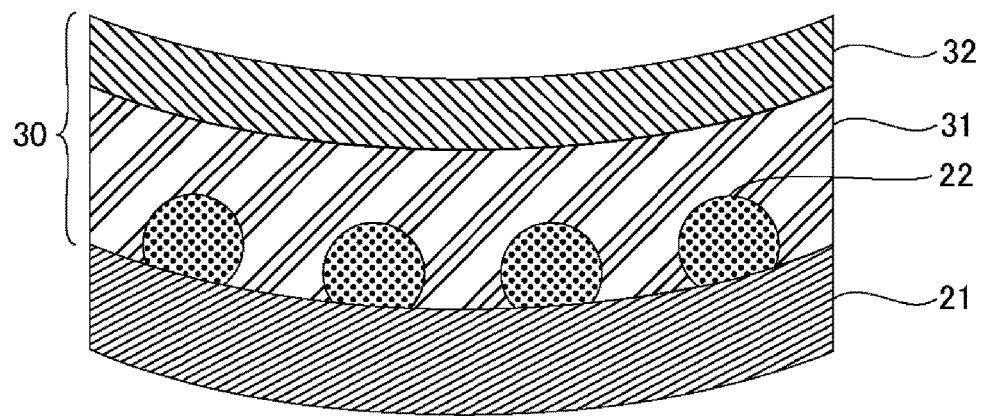
FIG. 3 is a schematic cross-sectional view illustrating a grinding step.

FIG. 3 is a schematic cross-sectional view illustrating a grinding step. The grinding step includes grinding a surface opposite to an application-surface of the protective tape 30. The surface opposite to the application-surface of the wafer 21 is secured to a grinding device and is ground. In the grinding step, the wafer 21 is ground to a thickness of 200 µm or less and may be ground to a thickness of 50 µm or less. Decreasing thickness of the wafer 21 increases warping of the wafer 21. It should be noted that warping of the wafer 21 is measured as the maximum value of the warp (z-axis) when the wafer 21 is placed on a planar stage (x-y plane).

(C) Thermosetting Adhesive Sheet Applying Step

Figure 4:
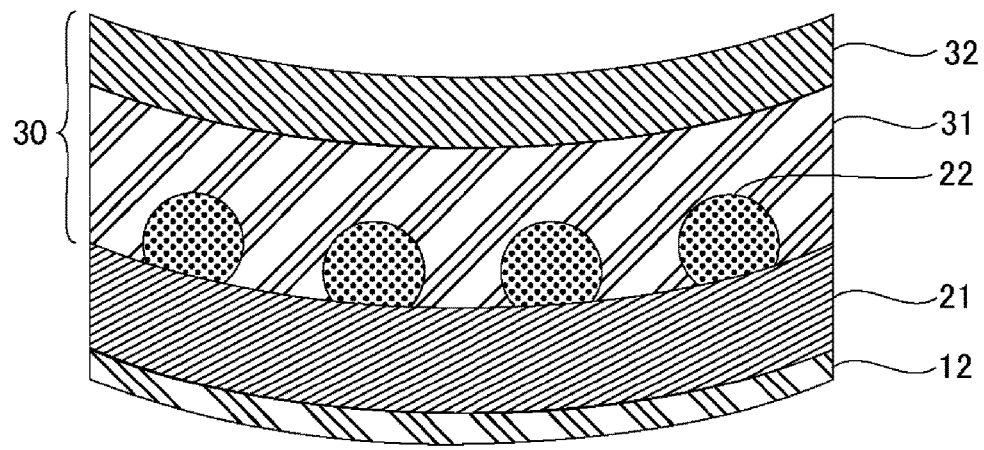
FIG. 4 is a schematic cross-sectional view illustrating a thermosetting adhesive sheet application step.

FIG. 4 is a schematic cross-sectional view illustrating a thermosetting adhesive sheet applying step. The thermosetting adhesive sheet applying step includes applying a thermosetting adhesive layer 12 of the thermosetting adhesive sheet to the grinding-side surface of the wafer 21.

(D) Protective Tape Peeling Step

Figure 5:
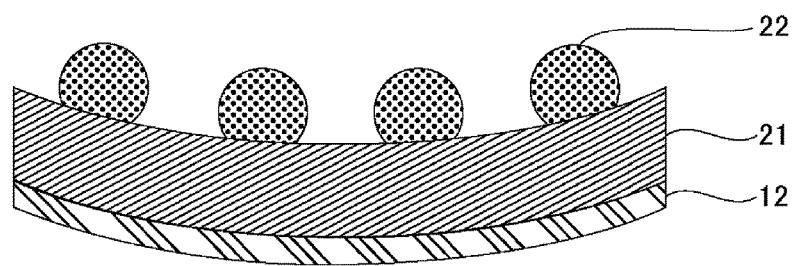
FIG. 5 is a schematic cross-sectional view illustrating a BG tape peeling step.

FIG. 5 is a schematic cross-sectional view illustrating a protective tape peeling step. The protective tape peeling step includes peeling the protective tape 30.

(E) Curing Step

Figure 6:
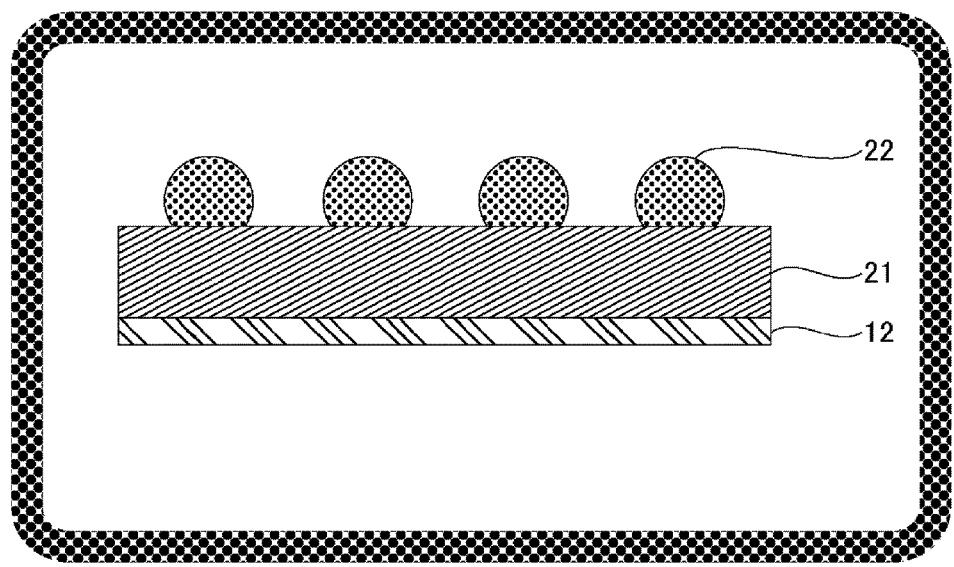
FIG. 6 is a schematic cross-sectional view illustrating a curing step.

FIG. 6 is a schematic cross-sectional view illustrating a curing step. The curing step includes curing the thermosetting adhesive layer 12. Regarding curing methods and curing conditions, known methods for curing thermosetting adhesives may be employed. In the curing step, for example, it is possible to cure the thermosetting adhesive layer 12 by curing at a temperature of 80 to 180° C. for 0.1 to 5 hours. This significantly shrinks the thermosetting adhesive layer 12 and generates a stress opposing the warp direction of the wafer 21, enabling the wafer 21 to be maintained in a flat state.

(F) Adhesive Tape Applying Step

Figure 7:
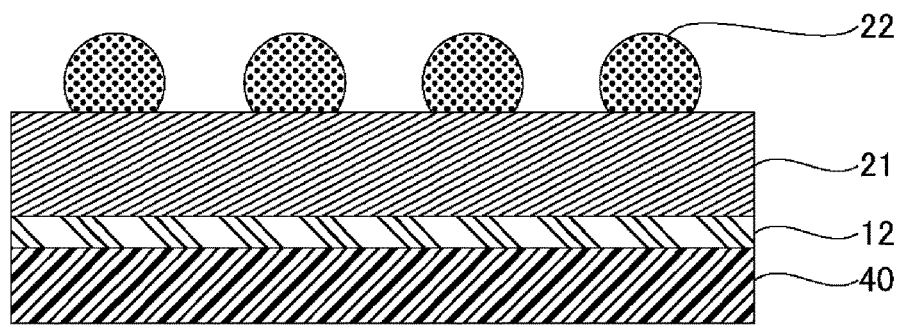
FIG. 7 is a schematic cross-sectional view illustrating a DC tape applying step.

FIG. 7 is a schematic cross-sectional view illustrating an adhesive tape applying step. The adhesive tape applying tape includes applying the adhesive tape 40 onto the grinding-side surface. The adhesive tape 40, known as dicing tape, protects and secures the wafer 21 from the dicing step (G) through the picking-up step (I).

The adhesive tape 40 is without particular limitation and known adhesive tapes may be used. In general, the adhesive tape 40 has an adhesive layer and a matrix film layer. Examples of the adhesive layer include polyethylene-based, acrylic-based, rubber-based, and urethane-based adhesives, among others. Examples of the matrix film layer include plastic films such as those of polyethylene terephthalate, polyethylene, polypropylene, and polyester, as well as porous matrix materials such as those of paper, cloth, and nonwoven fabric. The application device as well as conditions for applying the adhesive tape are without particular limitations, and well-known devices and conditions may be employed.

(G) Dicing Step

Figure 8:
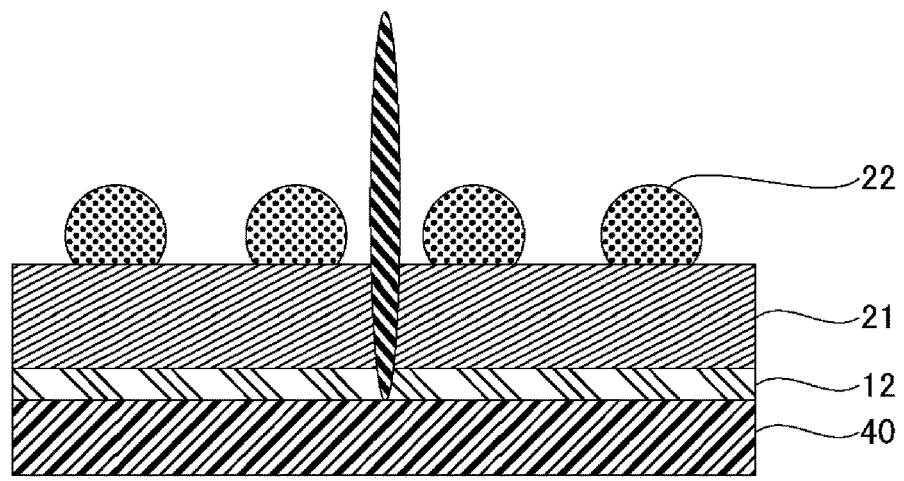
FIG. 8 is a schematic cross-sectional view illustrating a dicing step.

FIG. 8 is a schematic cross-sectional view illustrating a dicing step. The dicing step includes dicing the wafer 21, having the adhesive tape 40 applied thereon, to obtain individual semiconductor chips. The dicing method is without particular limitation, and known methods such as, for example, cutting apart the wafer 21 with a dicing saw may be employed.

(H) Expanding Step

Figure 9:
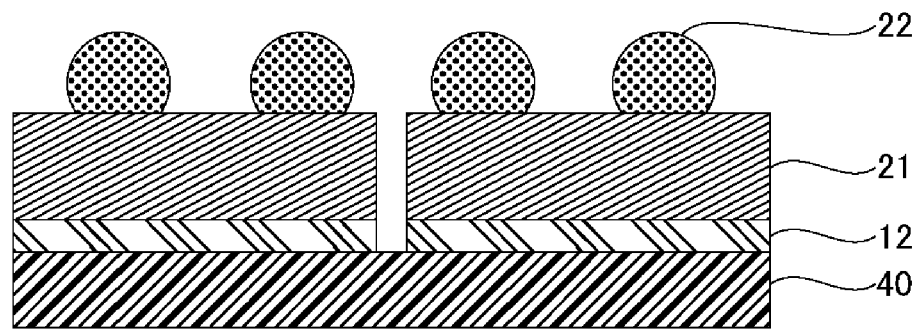
FIG. 9 is a schematic cross-sectional view illustrating an expanding step.

FIG. 9 is a schematic cross-sectional view illustrating an expanding step. The expanding step includes radially expanding the adhesive tape 40, on which separated individual semiconductor chips are adhered, to increase distances between the individual semiconductor chips.

(I) Picking-Up Step

Figure 10:
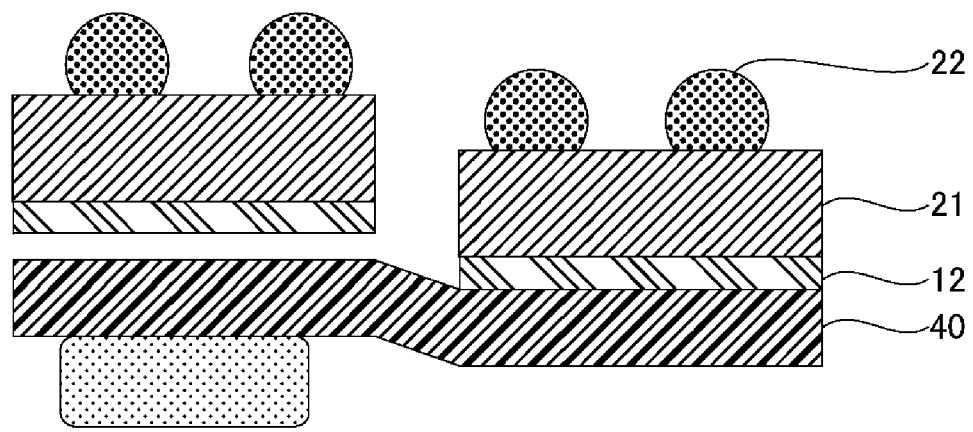
FIG. 10 is a schematic cross-sectional view illustrating a picking-up step.

FIG. 10 is a schematic cross-sectional view illustrating a picking-up step. The picking-up step includes detaching the semiconductor chips from the adhesive tape 40, on which the semiconductor chips are secured by adhesion, by pressing the underside surface of the adhesive tape 40; the detached semiconductor chips are suctioned up by a collet. The picked-up semiconductor chips are collected in a chip tray or are conveyed to a chip-mounting nozzle of a flip-chip bonder.

(J) Mounting Step

Figure 11:
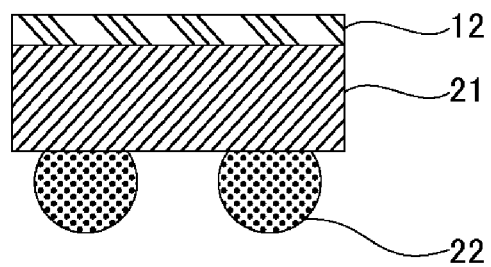
FIG. 11 is a schematic cross-sectional view illustrating a mounting step.

FIG. 11 is a schematic cross-sectional view illustrating a mounting step. The mounting step includes, for example, connecting the semiconductor chip and a circuit substrate using a circuit connecting material such as NCF (non-conductive film). Examples of the circuit substrate, without particular limitation, include plastic substrates such as polyimide substrates, glass epoxy substrates, and ceramic substrates. Furthermore, as a connection method, known methods such as those using thermal-bonding or reflow ovens can be used.

The method for manufacturing a semiconductor device according to the present embodiment can facilitate dicing and improve productivity because warping of the semiconductor wafer is reduced by applying the thermosetting adhesive sheet to the grinding-side surface of the semiconductor wafer and curing the sheet. Furthermore, because the protruding electrode is reinforced by curing the adhesive agent layer on the surface of the wafer on which the protruding electrode is formed before the dicing step, damage to the protruding electrode can be reduced in subsequent steps such as dicing, picking-up, and mounting.

Moreover, the semiconductor device obtained by the mounting step can achieve excellent connection reliability because the semiconductor chip has the thermosetting adhesive layer on the grinding-side surface and the adhesive agent layer on the protruding electrode-side surface.

EXAMPLES

3. Examples

Hereinafter, examples according to the present disclosure will be described.

3.1 First Examples

In the first examples, thermosetting adhesive sheets were manufactured and applied to patterned wafers in which warping had occurred to evaluate warping after curing the laminated bodies. The thermosetting adhesive sheets were evaluated for curing speed, adhesion reliability, alignment mark recognizability, and dicing tape application properties.

Thermosetting Adhesive Sheet Preparation

The components listed below were blended to prepare resin compositions. These were then applied to release-treated PET (polyethylene terephthalate) by using a bar coater and then dried in an oven at 80° C. for 3 minutes to prepare thermosetting adhesive sheets having thicknesses of 20 μm (cover release-treated PET (25 μm)/thermosetting adhesive sheet (20 μm)/base release-treated PET (50 μm).

FX293: fluorene phenoxy resin (manufactured by NIPPON STEEL & SUMIKIN CHEMICAL CO., LTD.)

YP-50: bisphenol A phenoxy resin (manufactured by NIPPON STEEL & SUMIKIN CHEMICAL CO., LTD.)

SG-80H: acrylic elastomer (manufactured by Nagase ChemteX Co., Ltd.)

RKB-5515B: butadiene elastomer (manufactured by RESINOUS KASEI CO., LTD.)

DCP: tricyclodecane dimethanol dimethacrylate (manufactured by SHIN-NAKAMURA CHEMICAL CO, LTD., (meth)acrylic equivalent weight (molecular weight/functional group number)=166)

A-DCP: tricyclodecane dimethanol diacrylate (manufactured by SHIN-NAKAMURA CHEMICAL CO, LTD., (meth)acrylic equivalent weight (molecular weight/functional group number)=152)

M-315: compound of isocyanurate ethylene-oxide-modified diacrylate and isocyanurate ethylene-oxide-modified triacrylate, (3 to 13% isocyanurate ethylene oxide-modified diacrylate content) (manufactured by Toagosei Co., Ltd., (meth)acrylic equivalent weight (molecular weight/functional group number)=144)

A-DPH: dipentaerythritol hexaacrylate (manufactured by SHIN-NAKAMURA CHEMICAL CO, LTD., (meth)acrylic equivalent weight (molecular weight/functional group number)=96)

UV-1700B: urethane acrylate (manufactured by The Nippon Synthetic Chemical Industry Co., Ltd. (meth)acrylic equivalent weight (molecular weight/functional group number)=222)

4-HBA: 4-hydroxy-butyl acrylate (manufactured by SHIN-NAKAMURA CHEMICAL CO, LTD., (meth)acrylic equivalent weight (molecular weight/number of functional groups)=144)

CEL-2021P: alicyclic epoxy resin (manufactured by Daicel Corporation)

JER1031S: special polyfunctional epoxy resin (Mitsubishi Chemical Corporation)

PEROYL L: dilauroyl peroxide (manufactured by NOF CORPORATION, one-minute half-life temperature: 116.4° C.)

PEROCTA O: 1,1,3,3-tetra-methyl butyl peroxy-2-ethyl-hexanoate (manufactured by NOF CORPORATION, one-minute half-life temperature: 116.4° C.)

PERHEXA V: n-butyl-4,4-bis(t-butylperoxy) valerate (manufactured by NOF CORPORATION, one-minute half-life temperature: 116.4° C.)

TD-2131: phenol novolac (manufactured by DIC Corporation)

U-CAT5002: DBU tetraphenylborate salt (San-Apro Ltd.)

Aerosil R202: silica (NIPPON AEROSIL CO., LTD)

20: carbon black

KBM-5103: acrylic silane coupling agent (Shin-Etsu Chemical Co., Ltd.)

KBM-403: epoxy silane coupling agent (Shin-Etsu Chemical Co., Ltd.)

Laminated Body Preparation

Thermosetting adhesive sheets having a thickness of 20 μm were applied onto a patterned wafer with a press and cured at 130° C. for one hour to obtain laminated bodies.

Eight-inch patterned wafers having a thickness of 200 μm were used. Furthermore, the average warping of the patterned wafers (sample size: 10) was 4 mm. It should be noted that warping of the patterned wafers was measured as the maximum value of the warp (z-axis) when one of the patterned wafers was placed on a planar stage (x-y plane).

Laminated Body Warping Evaluation

As in measurement of warping in the patterned wafers, warping of the laminated bodies was measured as the maximum value of the warp (z-axis) when one of the laminated bodies was placed on a planar stage (x-y plane). Laminated bodies having less than 1.0 mm of warping were evaluated as excellent (hereinafter represented as "E"), laminated bodies having 1.0 to 1.5 mm of warping were evaluated as good (hereinafter represented as "G"), laminated bodies having 1.5 to 2.5 mm of warping were evaluated as intermediate (hereinafter represented as I), and laminated bodies having 2.5 mm or more of warping were evaluated as fail (hereinafter represented as "F").

Thermosetting Adhesive Sheet Curing Speed Evaluation

A Fourier transform infrared spectrophotometer (FT/IR-4100 manufactured by JASCO Corporation) was used to measure the 20 μm-thick samples of the thermosetting adhesive sheets cured at 130° C. for one hour with a transmission method. The reaction rates of the sample thermosetting adhesive sheets were calculated from the ratios of measured intensities of acrylic monomer (unsaturated groups) in uncured thermosetting adhesive sheets to measured intensities of acrylic monomer (unsaturated groups) in completely cured thermosetting adhesive sheets. In the thermosetting adhesive sheets, reaction ratios of 80% or more were evaluated as E, reaction ratios of 50% to 80% were evaluated as G, and reaction ratios of less than 50% were evaluated as F.

Thermosetting Adhesive Sheet Adhesion Reliability Evaluation

The 20 μm-thick samples of the thermosetting adhesive sheets cured at 130° C. for one hour were measured for initial adhesive strength and adhesive strength after a reliability test with conditions of 85° C. and 85% RH for 1000 hours. Adhesive strength was measured in accordance with JIS K 6854 by a 90-degree peel test with a peel rate of 50 mm/min; peel strength was measured as the force required to peel. Adhesive strengths after the reliability test of 90% or more of the initial adhesive strength were evaluated as E, adhesive strengths after the reliability test of 80% to 90% of the initial adhesive strength were evaluated as G, and adhesive strengths after the reliability test of less than 80% of the initial adhesive strength were evaluated as F.

Thermosetting Adhesive Sheet Alignment Mark Recognizability Evaluation

Transmittance of infrared light (wavelength: 1 μm) was measured in the 20 μm-thick samples of the thermosetting adhesive sheets cured at 130° C. for one hour. IR transmittances of 50% or more were evaluated as E, IR transmittances of 30% to 50% were evaluated as G, and IR transmittances of less than 30% were evaluated as F.

Dicing Tape Application Properties Evaluation

Dicing tape was applied to the thermosetting adhesive layer side of the laminated bodies obtained by curing at 130° C. for one hour. The dicing tape was visually inspected for air bubbles which were evaluated as G when absent and F when present.

Example 1

A resin composition was prepared having 5 pts. mass of a fluorene phenoxy resin (FX293), 20 pts. mass of an acrylic elastomer (SG-80H), 50 pts. mass of a trifunctional acrylate (M-315), 5 pts. mass of an organic peroxide (PEROYL L), 100 pts. mass of silica (Aerosil R202), and 2 pts. mass of an acrylic silane coupling agent (KBM-5103), which had an additive average value of (meth)acrylic equivalent weights of 144 and an average cross-link density of 7.1E-03, to manufacture thermosetting adhesive sheets.

As represented in Table 1, the laminated bodies of the thermosetting adhesive sheets applied to patterned wafers and cured were evaluated as E for warping. Furthermore, the thermosetting adhesive sheets were evaluated as E for curing speed, E for adhesion reliability, E for alignment mark recognizability, and G for dicing tape application properties.

Example 2

Thermosetting adhesive sheets were manufactured in the same manner as in Example 1 with the exception that, instead of the trifunctional acrylate (M-315), 50 pts. mass of a bifunctional acrylate (A-DCP) was blended; the additive average value of (meth)acrylic equivalent weights (molecular weight/functional group number) was 152 and the average cross-link density was 6.6E-03.

As represented in Table 1, the laminated bodies of the thermosetting adhesive sheets applied to patterned wafers and cured were evaluated as E for warping. Furthermore, the thermosetting adhesive sheets were evaluated as E for curing speed, E for adhesion reliability, and E for alignment mark recognizability.

Example 3

Thermosetting adhesive sheets were manufactured in the same manner as in Example 1 with the exception that, instead of the trifunctional acrylate (M-315), 50 pts. mass of a bifunctional acrylate (DCP) was blended; the additive average value of (meth)acrylic equivalent weights (molecular weight/functional group number) was 166 and the average cross-link density was 6.0E-03.

As represented in Table 1, the laminated bodies of the thermosetting adhesive sheets applied to patterned wafers and cured were evaluated as E for warping. Furthermore, the thermosetting adhesive sheets were evaluated as E for curing speed, E for adhesion reliability, and E for alignment mark recognizability.

Example 4

Thermosetting adhesive sheets were manufactured in the same manner as in Example 1 with the exception that, instead of the trifunctional acrylate (M-315), 50 pts. mass of a polyfunctional acrylate (A-DPH) was blended; additive average value of (meth)acrylic equivalent weights (molecular weight/functional group number) was 96 and the average cross-link density was 1.0E-02.

As represented in Table 1, the laminated bodies of the thermosetting adhesive sheets applied to patterned wafers and cured were evaluated as E for warping. Furthermore, the thermosetting adhesive sheets were evaluated as E for curing speed, G for adhesion reliability, and E for alignment mark recognizability.

Example 5

Thermosetting adhesive sheets were manufactured in the same manner as in Example 1 with the exception that, instead of the trifunctional acrylate (M-315), 50 pts. mass of a polyfunctional urethane acrylate (UV-1700B) was blended; the additive average value of (meth)acrylic equivalent weights (molecular weight/functional group number) was 222 and the average cross-link density was 4.5E-03.

As represented in Table 1, the laminated bodies of the thermosetting adhesive sheets applied to patterned wafers and cured were evaluated as E for warping. Furthermore, the thermosetting adhesive sheets were evaluated as E for curing speed, G for adhesion reliability, and E for alignment mark recognizability.

Example 6

Thermosetting adhesive sheets were manufactured in the same manner as in Example 1 with the exception that, instead of the trifunctional acrylate (M-315), 20 pts. mass of a polyfunctional acrylate (A-DPH) was blended; the additive average value of (meth)acrylic equivalent weights (molecular weight/functional group number) was 96 and the average cross-link density was 1.0E-02.

As represented in Table 1, the laminated bodies of the thermosetting adhesive sheets applied to patterned wafers and cured were evaluated as E for warping. Furthermore, the

Example 7

Thermosetting adhesive sheets were manufactured in the same manner as in Example 1 with the exception that, instead of the trifunctional acrylate (M-315), 70 pts. mass of a polyfunctional acrylate (A-DPH) was blended; the additive average value of (meth)acrylic equivalent weights (molecular weight/functional group number) was 96 and the average cross-link density was 1.0E-02.

As represented in Table 1, the laminated bodies of the thermosetting adhesive sheets applied to patterned wafers and cured were evaluated as E for warping. Furthermore, the thermosetting adhesive sheets were evaluated as G for curing speed, G for adhesion reliability, and E for alignment mark recognizability.

Example 8

Thermosetting adhesive sheets were manufactured in the same manner as in Example 1 with the exception that, 30 pts. mass of a trifunctional acrylate (M-315), 18 pts. mass of a bifunctional methacrylate (DCP) and 2 pts. mass of a monofunctional acrylate (4-HBA) were blended; the additive average value of (meth)acrylic equivalent weights (molecular weight/functional group number) was 125 and the average cross-link density was 6.7E-03.

As represented in Table 1, the laminated bodies of the thermosetting adhesive sheets applied to patterned wafers and cured were evaluated as E for warping. Furthermore, the thermosetting adhesive sheets were evaluated as E for curing speed, E for adhesion reliability, and E for alignment mark recognizability.

Example 9

Thermosetting adhesive sheets were manufactured in the same manner as in Example 1 with the exception that 3 pts. mass of the fluorene phenoxy resin (FX293) and 2 pts. mass of a bisphenol A epoxy resin (YP-50) were blended; the additive average value of (meth)acrylic equivalent weights (molecular weight/functional group number) was 144 and the average cross-link density was 7.1E-03.

As represented in Table 1, the laminated bodies of the thermosetting adhesive sheets applied to patterned wafers and cured were evaluated as G for warping. Furthermore, the thermosetting adhesive sheets were evaluated as E for curing speed, G for adhesion reliability, and E for alignment mark recognizability.

Example 10

Thermosetting adhesive sheets were manufactured in the same manner as in Example 1 with the exception that the fluorene phenoxy resin (FX293) was not included and 25 pts. mass of the acrylic elastomer (SG-80H) was blended; the additive average value of (meth)acrylic equivalent weights (molecular weight/functional group number) was 144 and the average cross-link density was 7.1E-03.

As represented in Table 1, the laminated bodies of the thermosetting adhesive sheets applied to patterned wafers and cured were evaluated as G for warping. Furthermore, the thermosetting adhesive sheets were evaluated as E for curing speed, E for adhesion reliability, and E for alignment mark recognizability.

Example 11

Thermosetting adhesive sheets were manufactured in the same manner as in Example 1 with the exception that 15 pts. mass of the acrylic elastomer (SG-80H) and 5 pts. mass of a butadiene-based elastomer (RKB-5515B) were blended; the additive average value of (meth)acrylic equivalent weights (molecular weight/functional group number) was 144 and the average cross-link density was 7.1E-03.

As represented in Table 1, the laminated bodies of the thermosetting adhesive sheets applied to patterned wafers and cured were evaluated as E for warping. Furthermore, the thermosetting adhesive sheets were evaluated as E for curing speed, G for adhesion reliability, and G for alignment mark recognizability.

Example 12

Thermosetting adhesive sheets were manufactured in the same manner as in Example 1 with the exception that instead of the acrylic elastomer (SG-80H), 20 pts. mass of a butadiene-based elastomer (RKB-5515B) was blended; the additive average value of (meth)acrylic equivalent weights (molecular weight/functional group number) was 144 and the average cross-link density was 7.1E-03.

As represented in Table 1, the laminated bodies of the thermosetting adhesive sheets applied to patterned wafers and cured were evaluated as G for warping. Furthermore, the thermosetting adhesive sheets were evaluated as E for curing speed, G for adhesion reliability, and F for alignment mark recognizability.

Example 13

Thermosetting adhesive sheets were manufactured in the same manner as in Example 1 with the exception that 150 pts. mass of silica (Aerosil R202) was blended; the additive average value of (meth)acrylic equivalent weights (molecular weight/functional group number) was 144 and the average cross-link density was 7.1E-03.

As represented in Table 1, the laminated bodies of the thermosetting adhesive sheets applied to patterned wafers and cured were evaluated as E for warping. Furthermore, the thermosetting adhesive sheets were evaluated as E for curing speed, G for adhesion reliability, and E for alignment mark recognizability.

Example 14

Thermosetting adhesive sheets were manufactured in the same manner as in Example 1 with the exception that 50 pts. mass of silica (Aerosil R202) was blended; the additive average value of (meth)acrylic equivalent weights (molecular weight/functional group number) was 144 and the average cross-link density was 7.1E-03.

As represented in Table 1, the laminated bodies of the thermosetting adhesive sheets applied to patterned wafers and cured were evaluated as G for warping. Furthermore, the thermosetting adhesive sheets were evaluated as E for curing speed, E for adhesion reliability, and E for alignment mark recognizability.

Example 15

Thermosetting adhesive sheets were manufactured in the same manner as in Example 1 with the exception that 1 pt.

mass carbon black (#20) was blended; the additive average value of (meth)acrylic equivalent weights (molecular weight/functional group number) was 144 and the average cross-link density was 7.1E-03.

As represented in Table 2, the laminated bodies of the thermosetting adhesive sheets applied to patterned wafers and cured were evaluated as E for warping. Furthermore, the thermosetting adhesive sheets were evaluated as E for curing speed, E for adhesion reliability, and G for alignment mark recognizability.

Example 16

Thermosetting adhesive sheets were manufactured in the same manner as in Example 1 with the exception that, instead of PEROYL L, 5 pts. mass of PEROCTA O was blended; the additive average value of (meth)acrylic equivalent weights (molecular weight/functional group number) was 144 and the average cross-link density was 7.1E-03.

As represented in Table 2, the laminated bodies of the thermosetting adhesive sheets applied to patterned wafers and cured were evaluated as E for warping. Furthermore, the thermosetting adhesive sheets were evaluated as E for curing speed, E for adhesion reliability, and E for alignment mark recognizability.

Example 17

Thermosetting adhesive sheets were manufactured in the same manner as in Example 1 with the exception that 4 pts. mass of PEROYL L and 1 pts. mass of PERHEXA V were blended; the average additive average value of (meth)acrylic equivalent weights (molecular weight/functional group number) was 144 and the average cross-link density was 7.1E-03.

As represented in Table 2, the laminated bodies of the thermosetting adhesive sheets applied to patterned wafers and cured were evaluated as E for warping. Furthermore, the thermosetting adhesive sheets were evaluated as I for curing speed, E for adhesion reliability, and E for alignment mark recognizability.

Comparative Example 1

Thermosetting adhesive sheets were manufactured in the same manner as in Example 1 with the exception that, instead of the trifunctional acrylate (M-315), PEROYL L, and the acrylic silane coupling agent (KBM-5103), 50 pts. mass of an alicyclic epoxy resin (CEL-20210), 5 pts. mass of phenol novolac (TD-2131), 5 pts. mass of a DBU tetraphenylborate salt (U-CAT5002), and 2 pts. mass of an epoxy silane coupling agent (KBM-403) were blended.

As represented in Table 2, the laminated bodies of the thermosetting adhesive sheets applied to patterned wafers and cured were evaluated as I for warping. Furthermore, the thermosetting adhesive sheets were evaluated as F for curing speed, E for adhesion reliability, and G for alignment mark recognizability.

Comparative Example 2

Thermosetting adhesive sheets were manufactured in the same manner as in Example 1 with the exception that, instead of the trifunctional acrylate (M-315), PEROYL L, and the acrylic silane coupling agent (KBM-5103), 50 pts. mass of special polyfunctional epoxy resin (JER1031S), 5 pts. mass of phenol novolac (TD-2131), 5 pts. mass of a DBU tetraphenylborate salt (U-CAT5002), and 2 pts. mass of an epoxy silane coupling agent (KBM-403) were blended.

As represented in Table 2, the laminated bodies of the thermosetting adhesive sheets applied to patterned wafers and cured were evaluated as I for warping. Furthermore, the thermosetting adhesive sheets were evaluated as F for curing speed, E for adhesion reliability, G for alignment mark recognizability, and F for dicing tape application properties.

Comparative Example 3

Thermosetting adhesive sheets were manufactured in the same manner as in Example 1 with the exception that, instead of the trifunctional acrylate (M-315), 50 pts. mass of a monofunctional acrylate (4-HBA) was blended; the additive average value of (meth)acrylic equivalent weights (molecular weight/functional group number) was 144 and the average cross-link density was 6.9E-03.

As represented in Table 2, the laminated bodies of the thermosetting adhesive sheets applied to patterned wafers and cured were evaluated as F for warping. Furthermore, the thermosetting adhesive sheets were evaluated as E for curing speed, G for adhesion reliability, E for alignment mark recognizability, and F for dicing tape application properties.

Comparative Example 4

Thermosetting adhesive sheets were manufactured in the same manner as in Example 1 with the exception that 47.5 pts. mass of the trifunctional acrylate (M-315) and 2.5 pts mass of a monofunctional acrylate (4-HBA) was blended; the additive average value of (meth)acrylic equivalent weights (molecular weight/functional group number) was 102 and the average cross-link density was 7.1E-03.

As represented in Table 2, the laminated bodies of the thermosetting adhesive sheets applied to patterned wafers and cured were evaluated as I for warping. Furthermore, the thermosetting adhesive sheets were evaluated as E for curing speed, E for adhesion reliability, and E for alignment mark recognizability.

Comparative Example 5

Thermosetting adhesive sheets were manufactured in the same manner as in Example 1 with the exception that, instead of PEROYL L, 5 pts. mass of PERHEXA V was blended; the additive average value of (meth)acrylic equivalent weights (molecular weight/functional group number) was 144 and the average cross-link density was 7.1E-03.

As represented in Table 2, the laminated bodies of the thermosetting adhesive sheets applied to patterned wafers and cured were evaluated as I for warping. Furthermore, the thermosetting adhesive sheets were evaluated as F for curing speed, E for adhesion reliability, and E for alignment mark recognizability.

TABLE 1

| Component | Trade Name | Ex. 1 | Ex. 2 | Ex. 3 | Ex. 4 | Ex. 5 | Ex. 6 | Ex. 7 | Ex. 8 | Ex. 9 | Ex. 10 | Ex. 11 | Ex. 12 | Ex. 13 | Ex. 14 |
|---|---|---|---|---|---|---|---|---|---|---|---|---|---|---|---|
| fluorene phenoxy resin | FX293 | 5 | 5 | 5 | 5 | 5 | 5 | 5 | 5 | 3 | — | 5 | 5 | 5 | 5 |
| bisphenol A phenoxy resin | YP-50 | — | — | — | — | — | — | — | — | 2 | — | — | — | — | — |
| acrylic elastomer | SG-80H | 20 | 20 | 20 | 20 | 20 | 20 | 20 | 20 | 20 | 25 | 15 | — | 20 | 20 |
| butadiene elastomer | RKB-5515B | — | — | — | — | — | — | — | — | — | — | 5 | 20 | — | — |
| bifunctional methacrylate | DCP | — | — | 50 | — | — | — | — | 18 | — | — | — | — | — | — |
| bifunctional acrylate | A-DCP | — | 50 | — | — | — | — | — | — | — | — | — | — | — | — |
| trifunctional acrylate | M-315 | 50 | — | — | — | — | — | — | 30 | 50 | 50 | — | 50 | 50 | 50 |
| polyfunctional acrylate | A-DPH | — | — | — | 50 | — | 20 | 70 | — | — | — | — | — | — | — |
| polyfunctional acrylate | UV-1700B | — | — | — | — | 50 | — | — | — | — | — | — | — | — | — |
| monofunctional acylate | 4-HBA | — | — | — | — | — | — | — | 2 | — | — | — | — | — | — |
| alicyclic epoxy resin | CEL-2021P | — | — | — | — | — | — | — | — | — | — | — | — | — | — |
| special polyfunctional epoxy resin | JER 1031S | — | — | — | — | — | — | — | — | — | — | — | — | — | — |
| dilauroyl peroxide | PEROYL L | 5 | 5 | 5 | 5 | 5 | 5 | 5 | 5 | 5 | 5 | 5 | 5 | 5 | 5 |
| peroxyester | PEROCTA O | — | — | — | — | — | — | — | — | — | — | — | — | — | — |
| peroxyketal | PERHEXA V | — | — | — | — | — | — | — | — | — | — | — | — | — | — |
| phenol novolac | TD-2131 | — | — | — | — | — | — | — | — | — | — | — | — | — | — |
| DBU tetraphenylborate salt | U-CAT 5002 | — | — | — | — | — | — | — | — | — | — | — | — | — | — |
| silica (primary particle dia: 14 nm) | AEROSIL R202 | 100 | 100 | 100 | 100 | 100 | 100 | 100 | 100 | 100 | 100 | 100 | 100 | 150 | 50 |
| carbon black | #20 | — | — | — | — | — | — | — | — | — | — | — | — | — | — |
| acrylic silane coupling agent | KBM-5103 | 2 | 2 | 2 | 2 | 2 | 2 | 2 | 2 | 2 | 2 | 2 | 2 | 2 | 2 |
| epoxy silane coupling agent | KBM-403 | — | — | — | — | — | — | — | — | — | — | — | — | — | — |
| (Meth)Acrylic Equivalent Additive Average | | 144 | 152 | 166 | 96 | 222 | 96 | 96 | 125 | 144 | 144 | 144 | 144 | 144 | 144 |
| Average Cross-link Density | | 7.1E−03 | 6.6E−03 | 6.0E−03 | 1.0E−02 | 4.5E−03 | 1.0E−02 | 1.0E−02 | 6.7E−03 | 7.1E−03 | 7.1E−03 | 7.1E−03 | 7.1E−03 | 7.1E−03 | 7.1E−03 |
| Laminate Post-curing Warping | | E | E | E | E | E | G | E | E | G | G | E | G | E | G |
| Curing Speed | | E | E | E | E | E | E | E | E | E | E | E | E | E | E |
| Adhesion Reliability | | E | E | E | G | G | G | G | E | G | E | E | G | G | E |
| Alignment Mark Visibility | | E | E | E | E | E | E | E | E | E | E | E | G | F | E |
| DC Tape Application Properties | | G | — | — | — | — | — | — | — | — | — | — | — | — | — |

45

TABLE 2

| Component | Trade Name | Ex. 15 | Ex. 16 | Ex. 17 | Comp. 1 | Comp. 2 | Comp. 3 | Comp. 4 | Comp. 5 |
|---|---|---|---|---|---|---|---|---|---|
| fluorene phenoxy resin | FX293 | 5 | 5 | 5 | 5 | 5 | 5 | 5 | 5 |
| bisphenol A phenoxy resin | YP-50 | — | — | — | — | — | — | — | — |
| acrylic elastomer | SG-80H | 20 | 20 | 20 | 20 | 20 | 20 | 20 | 20 |
| butadiene elastomer | RKB-5515B | — | — | — | — | — | — | — | — |
| bifunctional methacrylate | DCP | — | — | — | — | — | — | — | — |
| bifunctional acrylate | A-DCP | — | — | — | — | — | — | — | — |
| trifunctional acrylate | M-315 | 50 | 50 | 50 | — | — | — | 47.5 | 50 |
| polyfunctional acrylate | A-DPH | — | — | — | — | — | — | — | — |
| monofunctional acrylate | 4-HBA | — | — | — | — | — | 50 | 2.5 | — |
| alicyclic epoxy resin | CEL-2021P | — | — | — | 50 | — | — | — | — |
| special polyfunctional epoxy resin | JER 1031S | — | — | — | — | 50 | — | — | — |
| dilauroyl peroxide | PEROYL L | 5 | — | 4 | — | — | 5 | 5 | — |
| peroxyester | PEROCTA O | — | 5 | — | — | — | — | — | — |
| peroxyketal | PERHEXA V | — | — | 1 | — | — | — | — | 5 |
| phenol novolac | TD-2131 | — | — | — | 5 | 5 | — | — | — |
| DBU tetraphenylborate salt | U-CAT 5002 | — | — | — | 5 | 5 | — | — | — |
| silica (primaly particle dia: 14 nm) | AEROSIL R202 | 100 | 100 | 100 | 100 | 100 | 100 | 100 | 100 |
| carbon black | #20 | 1 | — | — | — | — | — | — | — |
| acrylic silane coupling agent | KBM-5103 | 2 | 2 | 2 | — | — | 2 | 2 | 2 |
| epoxy silane coupling agent | KBM-403 | — | — | — | 2 | 2 | — | — | — |

TABLE 2-continued

| Component | Trade Name | Ex. 15 | Ex. 16 | Ex. 17 | Comp. 1 | Comp. 2 | Comp. 3 | Comp. 4 | Comp. 5 |
|---|---|---|---|---|---|---|---|---|---|
| (Meth)Acrylic Equivalent Additive Average | | 144 | 144 | 144 | — | — | 144 | 102 | 144 |
| Average Cross-link Density | | 7.1E−03 | 7.1E−03 | 7.1E−03 | — | — | 6.9E−03 | 7.1E−03 | 7.1E−03 |
| Laminate Post-curing Warping | | E | E | E | I | I | F | I | I |
| Curing Speed | | E | E | I | F | F | E | E | F |
| Adhesion Reliability | | E | E | E | E | E | G | E | E |
| Alignment Mark Visibility | | G | E | E | G | G | E | E | E |
| DC Tape Application Properties | | — | — | — | — | F | F | — | — |

In cases of using an epoxy thermosetting binder as in Comparative Examples 1 and 2, high curing speeds were not achieved, and wafer warping could not be significantly reduced due to low stress opposing the warp direction of the wafer. Furthermore, in cases of blending a monofunctional (meth)acrylate as in Comparative Example 3, wafer warping could not be significantly reduced due to low stress opposing the warp direction of the wafer. Moreover, in cases of not blending the polyfunctional (meth)acrylate at more than 95 wt % with respect to total (meth)acrylate content as in Comparative Example 4, wafer warping could not be significantly reduced due to low stress opposing the warp direction of the wafer. In addition, in cases of blending an organic peroxide having a one-minute half-life temperature exceeding 130° C. as in Comparative example 5, wafer warping could not be significantly reduced due to low stress opposing the warp direction of the wafer In contrast, as in Examples 1 to 17, it was confirmed that blending a polymer containing an elastomer, a (meth)acrylate containing more than 95 wt % of polyfunctional (meth)acrylate with respect to total (meth)acrylate content, and an organic peroxide having a one-minute half-life temperature of 130° C. or lower achieved high curing speeds and significantly reduced wafer warping due to high stress opposing the warp direction of the wafer.

Furthermore, comparing Examples 1 to 5, having the same components excepting the polyfunctional (meth)acrylate, revealed that an additive average value of (meth)acrylic equivalent weights of 100 to 200 g/eq resulted in favorable evaluations for all of curing speed, adhesion reliability, and alignment mark recognizability.

Moreover, comparing Examples 4, 6, and 7, having the same components but different blending amounts of the polyfunctional (meth)acrylate, revealed that a blending amount of the polyfunctional (meth)acrylate of 30 pts. mass or more resulted in favorable evaluations for warping of the laminated bodies.

REFERENCE SIGNS LIST

11 matrix film layer, 12 thermosetting adhesive layer, 21 wafer, 22 protruding electrode, 30 protective tape, 31 thermoplastic resin layer, 32 matrix film layer

The invention claimed is:

1. A thermosetting adhesive sheet to be applied to a grinding-side surface of a semiconductor wafer when dicing the semiconductor wafer comprising:
   a polymer containing an elastomer;
   a (meth)acrylate containing more than 95 wt % of a polyfunctional (meth)acrylate with respect to total (meth)acrylate content;
   an organic peroxide having a one-minute half-life temperature of 130° C. or lower; and
   a transparent filler,
   wherein the transparent filler is contained at 50 to 150 pts. mass with respect to 25 pts. mass of the polymer.

2. The thermosetting adhesive sheet according to claim 1, wherein the (meth)acrylate has an additive average value of (meth)acrylic equivalent weights of 80 g/eq to 230 g/eq.

3. The thermosetting adhesive sheet according to claim 2, wherein the (meth)acrylate is contained at 20 to 70 pts. mass with respect to 25 pts. mass of the polymer.

4. The thermosetting adhesive sheet according to claim 2, wherein the polymer further contains a phenoxy resin.

5. The thermosetting adhesive sheet according to claim 2, wherein the polymer contains a fluorene phenoxy resin and an acrylic elastomer.

6. The thermosetting adhesive sheet according to claim 2, wherein the organic peroxide contains dilauroyl peroxide.

7. The thermosetting adhesive sheet according to claim 1, wherein the (meth)acrylate is contained at 20 to 70 pts. mass with respect to 25 pts. mass of the polymer.

8. The thermosetting adhesive sheet according to claim 1, wherein the polymer further contains a phenoxy resin.

9. The thermosetting adhesive sheet according to claim 1, wherein the polymer contains a fluorene phenoxy resin and an acrylic elastomer.

10. The thermosetting adhesive sheet according to claim 1, wherein the organic peroxide contains dilauroyl peroxide.

11. A method for manufacturing a semiconductor device comprising:
    a grinding step of grinding a semiconductor wafer;
    a thermosetting adhesive sheet applying step of applying a thermosetting adhesive sheet to a grinding-side surface of the semiconductor wafer;
    a curing step of curing the thermosetting adhesive sheet to reduce warping of the semiconductor wafer;
    a dicing tape applying step of applying a dicing tape to a side of the semiconductor wafer to which the thermosetting adhesive sheet is applied; and
    a dicing step of dicing the semiconductor wafer to which the dicing tape is applied to obtain individual semiconductor chips,
    wherein the thermosetting adhesive sheet contains a polymer containing an elastomer, a (meth)acrylate containing more than 95 wt % of a polyfunctional (meth)acrylate with respect to total (meth)acrylate content, an organic peroxide having a one-minute half-life temperature of 130° C. or lower, and a transparent filler, and
    the transparent filler is contained at 50 to 150 pts. mass with respect to 25 pts. mass of the polymer.

12. The method for manufacturing a semiconductor device according to claim 11, wherein the grinding step includes grinding to a thickness of 200 μm or less.

13. The method for manufacturing a semiconductor device according to claim 11, wherein the (meth)acrylate has an additive average value of (meth)acrylic equivalent weights of 80 g/eq to 230 g/eq.

14. The method for manufacturing a semiconductor device according to claim 11, wherein the (meth)acrylate is contained at 20 to 70 pts. mass with respect to 25 pts. mass of the polymer.

15. The method for manufacturing a semiconductor device according to claim 11, wherein the polymer further contains a phenoxy resin.

* * * * *